(12) United States Patent
Zhang

(10) Patent No.: US 7,411,376 B2
(45) Date of Patent: Aug. 12, 2008

(54) VOLTAGE REGULATOR HAVING OVERCURRENT PROTECTION CIRCUIT AND METHOD MANUFACTURING VOLTAGE REGULATOR

(75) Inventor: Wei Zhang, Chiba (JP)

(73) Assignee: Seiko Instruments Inc. (JP)

( * ) Notice: Subject to any disclaimer, the term of this patent is extended or adjusted under 35 U.S.C. 154(b) by 171 days.

(21) Appl. No.: 11/061,495

(22) Filed: Feb. 18, 2005

(65) Prior Publication Data
US 2005/0185490 A1 Aug. 25, 2005

(30) Foreign Application Priority Data
Feb. 18, 2004 (JP) ............... 2004-041495

(51) Int. Cl.
*G05F 1/573* (2006.01)
*H05H 7/00* (2006.01)
*H02H 9/00* (2006.01)

(52) U.S. Cl. .................... 323/277; 323/316; 361/18

(58) Field of Classification Search ............... 323/316, 323/277; 363/56.1, 56.01; 365/205; 361/18
See application file for complete search history.

(56) References Cited

U.S. PATENT DOCUMENTS

| 6,201,674 | B1 * | 3/2001 | Warita et al. ............... 361/18 |
| 6,751,148 | B2 * | 6/2004 | Kang .................... 365/225.7 |
| 7,019,581 | B1 * | 3/2006 | Potanin et al. ............. 327/427 |
| 2003/0011952 | A1 * | 1/2003 | Fukui ..................... 361/93.1 |

\* cited by examiner

*Primary Examiner*—Gary L Laxton
*Assistant Examiner*—Ramy Ramadan
(74) *Attorney, Agent, or Firm*—Adams & Wilks

(57) ABSTRACT

A voltage regulator has a sense transistor through which a sense current flows in accordance with a magnitude of a load current, and a sense resistor through which the sense current flows. A control transistor controls the load current in accordance with a voltage across the sense resistor. A current measurement transistor measures the sense current flowing through the sense transistor and is disposed adjacent to the sense transistor. A measuring characteristics transistor measures characteristics of the control transistor and is disposed adjacent to the control transistor.

1 Claim, 4 Drawing Sheets

US 7,411,376 B2

VOLTAGE REGULATOR HAVING OVERCURRENT PROTECTION CIRCUIT AND METHOD MANUFACTURING VOLTAGE REGULATOR

BACKGROUND OF THE INVENTION

1. Field of the Invention

The present invention relates in general to a voltage regulator, and more particularly to an overcurrent protection circuit for a voltage regulator.

2. Description of the Related Art

FIG. 3 shows a configuration of a conventional overcurrent protection circuit for a voltage regulator. A reference voltage source 101 supplies a constant-voltage Vref to an inverted input terminal of an error amplifier 102. An output of the error amplifier 102 is connected to a gate of a PMOS output driver transistor 105, and is also connected to a gate of a first PMOS sense transistor 106, a gate of a second PMOS sense transistor 115, and a drain of a PMOS transistor 107 of an overcurrent protection circuit 103. A source of the PMOS output driver transistor 105 is connected to an input terminal IN and a drain of the same is connected to an output terminal OUT. A load resistor 114, a capacitor 113, and a voltage dividing circuit 104 consisting of resistors 111 and 112 are connected to the output terminal OUT. The voltage dividing circuit 104 supplies a divided voltage of an output voltage VOUT to a non-inverted input terminal of the error amplifier 102.

The overcurrent protection circuit 103 includes: the first and second PMOS sense transistors 106 and 115; the PMOS transistor 107; an NMOS transistor 108; resistors 109 and 110; first, second, and third PMOS level shifters 120, 119, and 118; and NMOS transistors 116 and 117 constituting a current mirror circuit. Here, the PMOS output driver transistor 105 has a gate width which is several times (e.g., 100,000 times) as large as that of the first PMOS sense transistor 106 for monitoring a load current Iout of the voltage regulator. Also, the PMOS output driver transistor 105 is designed so as to show a mirror relationship with the first and second PMOS sense transistors 106 and 115.

The conventional overcurrent protection circuit for a voltage regulator shown in FIG. 3 operates as follows.

If an amount of load current Iout supplied by the PMOS output driver transistor 105 to the load 114 is little, a current Isense flowing to the first PMOS sense transistor 106 is small in proportion to it. Thus, a voltage difference generated across the resistor 109 is also small and the NMOS transistor 108 is in a non-conductive state. Therefore, since a current does not flow to the NMOS transistor 108, a voltage difference is not generated across the resistor 110 and the PMOS transistor is also in a non-conductive state.

However, when a load current Iout supplied by the PMOS output driver transistor 105 to the load 114 increases, a current Isense flowing to the first PMOS sense transistor 106 also increases in proportion to it and a voltage generated across the resistor 109 also increases. Thus, the NMOS transistor 108 is in a conductive state. When the NMOS transistor 108 becomes conductive and a voltage difference generated across the resistor 110 increases, the PMOS transistor 107 conducts to increase a gate voltage of the PMOS output driver transistor 105. Thus, a driving ability of the PMOS output driver transistor 105 decreases and an output voltage OUT falls. In this way, elements are prevented from being destroyed by an overload current.

Moreover, operating states of the PMOS output driver transistor 105 and the first PMOS sense transistor 106 are usually made identical to each other based on an operation of a circuit including the second PMOS sense transistor 115, the first, second, and third PMOS level shifters 120, 119, and 118, and the NMOS transistors 116 and 117 constituting the current mirror circuit. In this case, a ratio between a value of a current caused to flow through the PMOS output driver transistor 105 and a value of a current caused to flow through the first PMOS sense transistor 106 is determined based on a transistor size ratio between the PMOS output driver transistor 105 and the first PMOS sense transistor 106. Thus, it is possible to set a load current Ipro permitting the overcurrent protecting function to be valid (refer to JP 2003-29856 A (pp. 1 to 6, and FIG. 1)).

However, the conventional overcurrent protection circuit for a voltage regulator involves a problem in that dispersion occurs in the load current Ipro permitting the overcurret protecting function to be valid due to manufacture dispersion. That is, a threshold voltage value Vth of the NMOS transistor 108 disperses. Moreover, the transistor size ratio between the PMOS output driver transistor 105 and the first PMOS sense transistor 106 also disperses due to the manufacture dispersion. Consequently, as shown in FIG. 4, the load current Ipro permitting the overcurrent protecting function to be valid greatly disperses from a target load current value Itype.

SUMMARY OF THE INVENTION

In order to solve the problems described above, a measurement circuit including at least one element as a constituent element of a voltage regulator is added to an overcurrent protection circuit for a voltage regulator according to the present invention. More specifically, for example, a resistance value of the resistor 109 is trimmed based on a substantially actually measured value of the current Isense which is caused to flow through the first PMOS sense transistor 106 in proportion to the load current Ipro permitting the overcurrent protecting function to be valid, and a substantially actually measured value of the threshold voltage value Vth of the NMOS transistor 108 using the measurement circuit, whereby the manufacture dispersion of the set load current IPro permitting the overcurrent protecting function to be valid is made small.

In addition, a third PMOS sense transistor having the same transistor size as that of the first PMOS sense transistor, and a fourth PMOS level shifter are added, whereby the operating states of the first and third PMOS sense transistors are made usually identical to each other, and thus a current caused to flow through the first PMOS sense transistor and a current caused to flow through the third PMOS sense transistor become equal to each other. Moreover, the first and third PMOS sense transistors are disposed so as to be adjacent to each other in terms of layout, thereby minimizing differences in transistor size and characteristics between the first and third PMOS sense transistors due to the manufacture dispersion. As a result, the current Isense which is caused to flow through the first PMOS sense transistor in proportion to the load current is obtained based on the measurement for the current caused to flow through the third PMOS sense transistor.

In addition, an NMOS transistor having the same transistor size as that of the NMOS transistor 108 is added, and the NMOS transistor 108 and the added NMOS transistor are disposed so as to be adjacent to each other in terms of the layout, thereby minimizing a difference in threshold voltage value Vth between the NMOS transistor 108 and the added NMOS transistor due to the manufacture dispersion. The threshold voltage value Vth of the added NMOS transistor is actually measured, thereby obtaining the threshold voltage value Vth of the NMOS transistor 108. Thus, the resistance value of the resistor 109 is adjusted through the trimming using those actually measured values, whereby the dispersion of the set load current Ipro permitting the overcurrent protecting function to be valid is made small.

In the overcurrent protection circuit for a voltage regulator according to the present invention, it is possible to substantially measure the current Isense which is caused to flow through the first PMOS sense transistor 106 in proportion to the load current Ipro permitting the overcurrent protecting function to be valid, and the threshold voltage value Vth of the NMOS transistor 108. The resistance value of the resistor 109 is trimmed using those actually measured values, whereby the manufacture dispersion of the set load current Ipro permitting the overcurrent protecting function to be valid is made small.

DETAILED DESCRIPTION OF THE PREFERRED EMBODIMENTS

Embodiments of the present invention will hereinafter be described in detail with reference to the accompanying drawings.

First Embodiment

Figure 1:
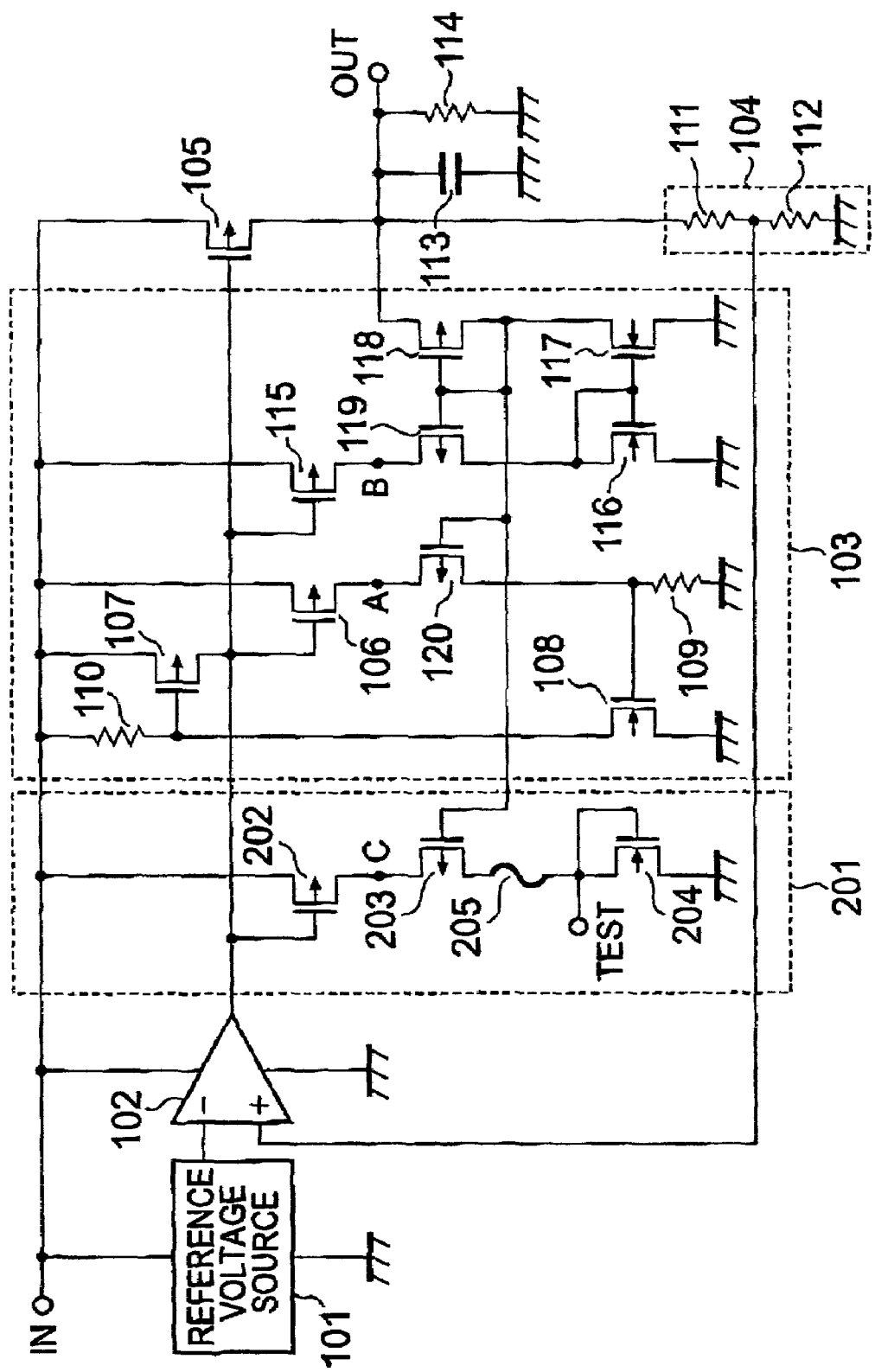
FIG. 1 is a circuit diagram showing a configuration of a voltage regulator according to a first embodiment of the present invention.

FIG. 1 is a circuit diagram showing a configuration of a voltage regulator according to a first embodiment of the present invention.

A reference voltage source 101 supplies a constant voltage Vref to an inverted input terminal of an error amplifier 102. An output terminal of the error amplifier 102 is connected to a gate of a PMOS output driver transistor 105, and to a gate of a first PMOS sense transistor 106, a gate of a second PMOS sense transistor 115, and a drain of a PMOS transistor 107 in an overcurrent protection circuit 103. A source of the PMOS output driver transistor 105 is connected to an input terminal IN, and a drain of the PMOS output driver transistor 105 is connected to an output terminal OUT. A load resistor 114, a capacitor 113, and a voltage dividing circuit 104 constituted by resistors 111 and 112 are connected to the output terminal OUT. The voltage dividing circuit 104 supplies a voltage obtained through the voltage division of an output voltage VOUT to a non-inverted input terminal of the error amplifier 102.

The overcurrent protection circuit 103 is connected between an output terminal of the error amplifier 102 and the gate terminal of the PMOS output driver transistor 105 in order to monitor the load current Iout supplied from the PMOS output driver transistor 105 to control an overcurrent of the load current Iout.

A measurement circuit 201 includes a third PMOS sense transistor 202 (current measurement transistor) having the same transistor size as that of the first PMOS sense transistor 106 of the overcurrent protection circuit 103, a fourth PMOS level shifter 203 (measuring characteristics transistor) having the same transistor size as that of the first PMOS level shifter 120 (control transistor) of the overcurrent protection circuit 103, an NMOS transistor 204 having the same transistor size as that of the NMOS transistor 108 of the overcurrent protection circuit 103, and a fuse 205.

A source of the third PMOS sense transistor 202 is connected to a source of the first PMOS sense transistor 106, a gate of the third PMOS sense transistor 202 is connected to the gate of the first PMOS sense transistor 106, and a drain of the third PMOS sense transistor 202 is connected to a source of the fourth PMOS level shifter 203. A gate of the fourth PMOS level shifter 203 is connected to each of gates of the first, second, and third PMOS level shifters 120, 119, and 118. Also, a drain of the fourth PMOS level shifter 203 is connected to a measurement terminal TEST through the fuse 205. Both a gate and a drain of the NMOS transistor 204 are reconnected to the measurement terminal TEST.

Since the first and third PMOS sense transistor 106 and 202 have the same transistor size and thus are equal in gate to source voltage to each other, a current caused to flow through the third PMOS sense transistor 202 becomes equal to a current caused to flow through the first PMOS sense transistor 106. A current caused to flow through the fourth PMOS level shifter 203 also becomes equal to a current caused to flow through the first PMOS level shifter 120. Thus, the first and fourth PMOS level shifters 120 and 203 also become equal in gate to source voltage to each other. In other words, a voltage at a node C also becomes nearly equal to a voltage at a node A. Consequently, the first and third PMOS sense transistors 106 and 202 also become equal in source to drain voltage to each other, and hence are usually identical in operating state to each other.

The first and third PMOS sense transistors 106 and 202 are disposed so as to be adjacent to each other in terms of the layout, thereby minimizing differences in transistor size and characteristics between the first and third PMOS sense transistors 106 and 202 due to the manufacture dispersion. Consequently, a current Isense caused to flow through the first PMOS sense transistor 106 and a current caused to flow through the third PMOS sense transistor 202 usually become equal to each other.

In addition, the NMOS transistors 108 and 204 are disposed so as to be adjacent to each other in terms of the layout, thereby minimizing a difference in threshold voltage value Vth between the NMOS transistors 108 and 204 due to the manufacture dispersion.

Next, a procedure for setting a load current Ipro permitting the overcurrent protecting function to be valid will be described with reference to FIG. 1.

First of all, an input voltage is applied to the input terminal IN and a resistance value of the load resistor 114 is then adjusted in order to obtain the load current Ipro permitting the overcurrent protecting function to be valid. An ammeter is inserted between the measurement terminal TEST and the ground to measure a current Im which is being caused to flow through the third PMOS sense transistor 202. The measured current Im is equal to the current Isense which is being caused to flow through the first PMOS sense transistor 106. Hence, the current Im is judged as the current Isense which is being caused to flow through the first PMOS sense transistor 106 so as to permit the overcurrent protecting function to be valid.

Next, in a state in which no input voltage is applied to the input terminal IN, a constant current is injected to the measurement terminal TEST in order to measure a voltage appearing at the measurement terminal TEST. The threshold voltage value Vth of the NMOS transistor 204 can be calculated from the measured voltage value. The NMOS transistors 108 and 204 are nearly equal in threshold voltage value Vth to each other. Hence, the threshold voltage value Vth of the NMOS transistor 204 is judged as the threshold voltage value Vth of the NMOS transistor 108.

Consequently, a target resistance value of the sense resistor 109 can be calculated from the actually measured current Im caused to flow through the first PMOS sense transistor 106, and The actually measured threshold voltage value Vth of NMOS transistor 108. The trimming of the resistance value of the resistor 109 to the target resistance value makes it possible to precisely set the load current IPro permitting the overcurrent protecting function to be valid.

In addition, in case of no provision of the NMOS transistor 204 in the measurement current 201 of FIG. 1, there is offered an effect that even when there is the dispersion in the transistor size ratio between the PMOS output driver transistor 105 and the first PMOS sense transistor 106 due to the manufacture dispersion, if only the current Isense being caused to flow through the first PMOS sense transistor 106 is measured, the dispersion in the load current Ipro permitting the overcurrent protecting function to be valid can be reduced through the trimming of the resistance value of the resistor 109.

Figure 4:
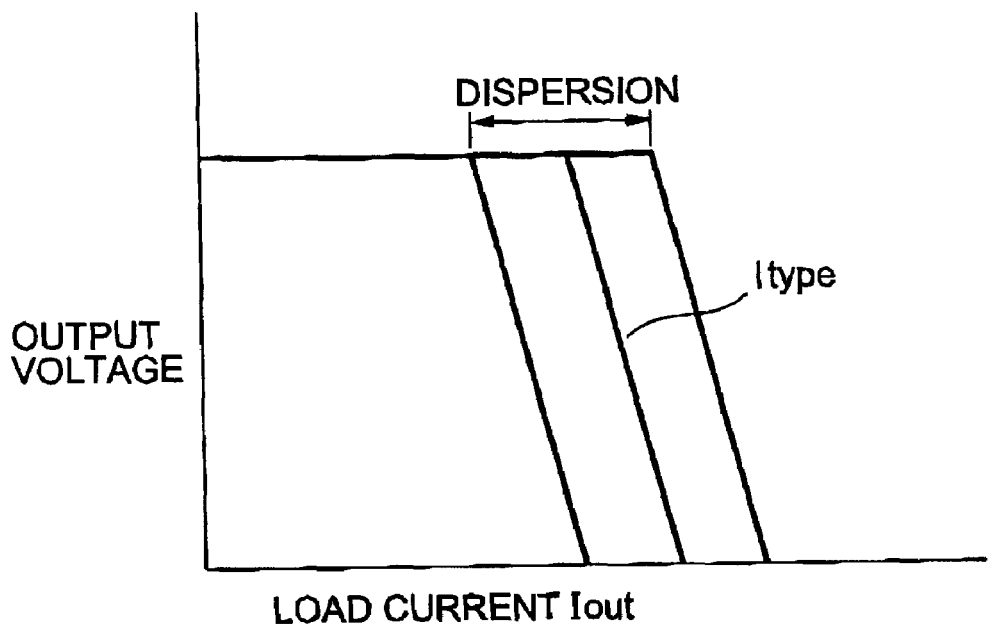
FIG. 4 is a graphical representation showing a relationship between a load current and an output voltage in the conventional voltage regulator.
Figure 5:
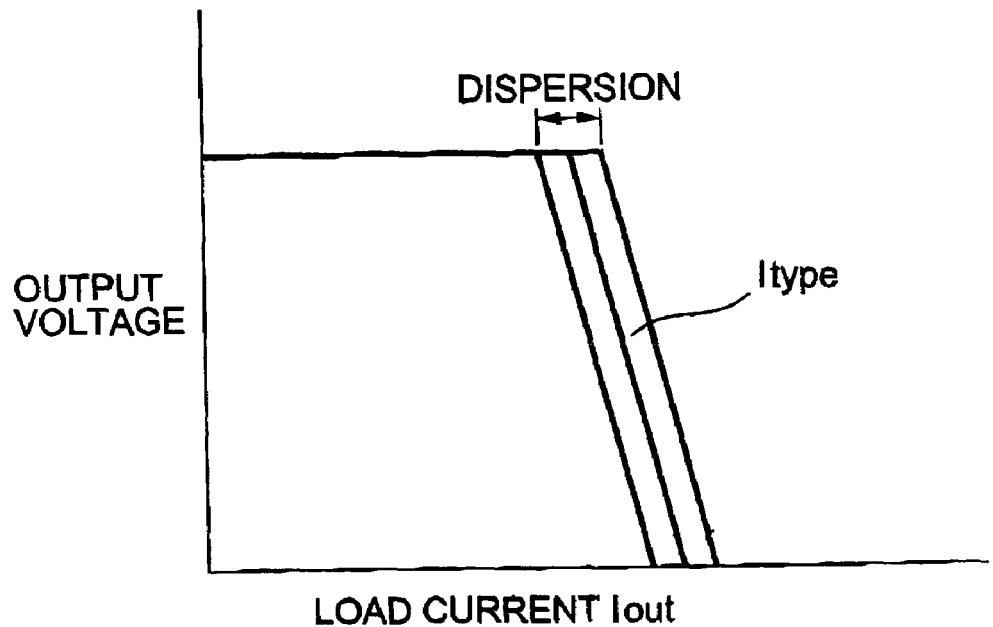
FIG. 5 is a graphical representation showing a relationship between a load current and an output voltage in the voltage regulator of the present invention.

FIG. 5 shows current dispersion characteristics of the first embodiment. The horizontal and the vertical axes indicate load current and output voltage, respectively, and the graph shows load current Ipro. As shown in FIG. 5, the load current Ipro permitting the overcurrent protecting function to be valid of the first embodiment disperses from a target load current value Itype smaller than that of the prior case shown in the FIG. 4.

Second Embodiment

Figure 2:
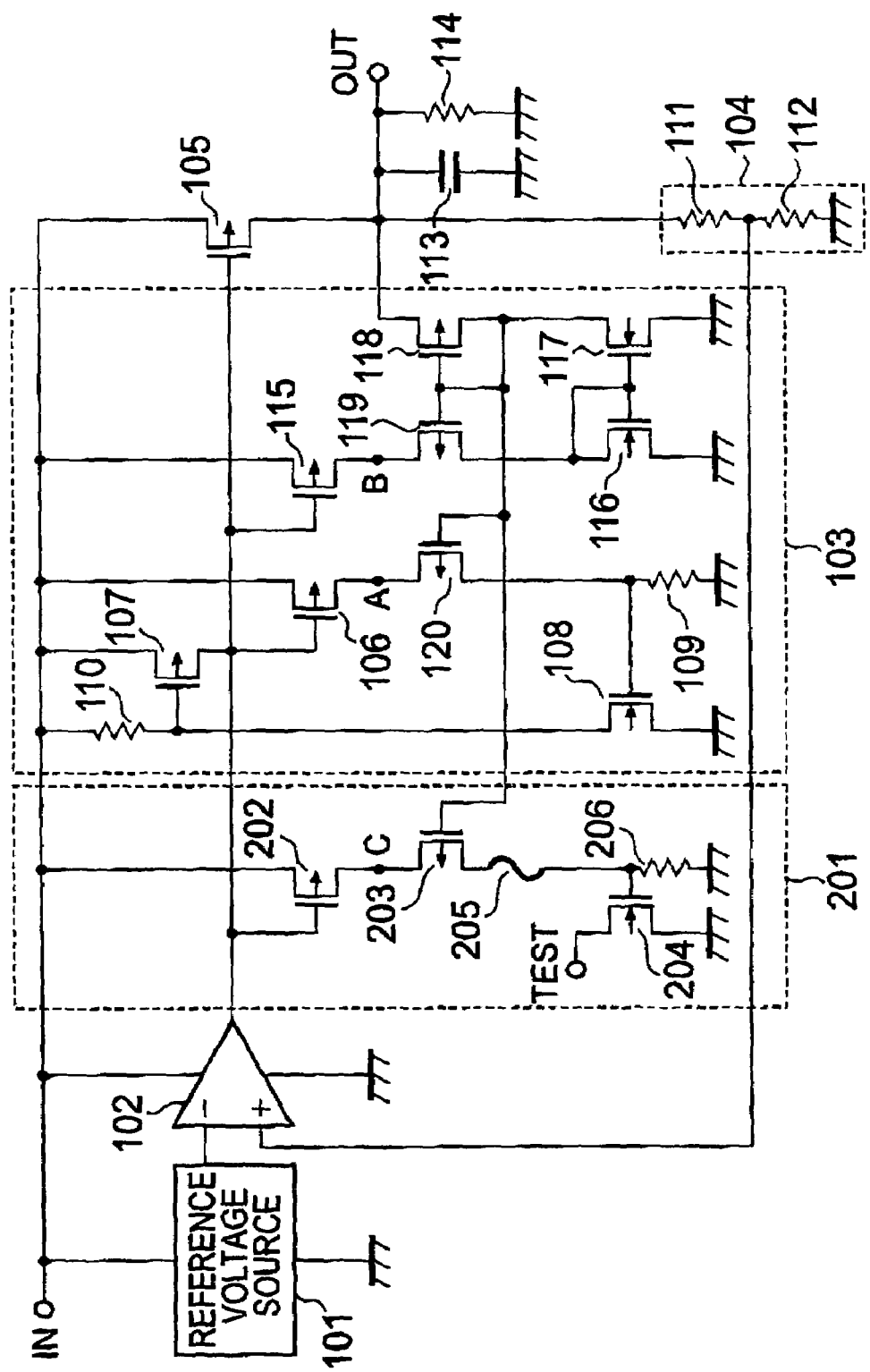
FIG. 2 is a circuit diagram showing a configuration of a voltage regulator according to a second embodiment of the present invention.
Figure 3:
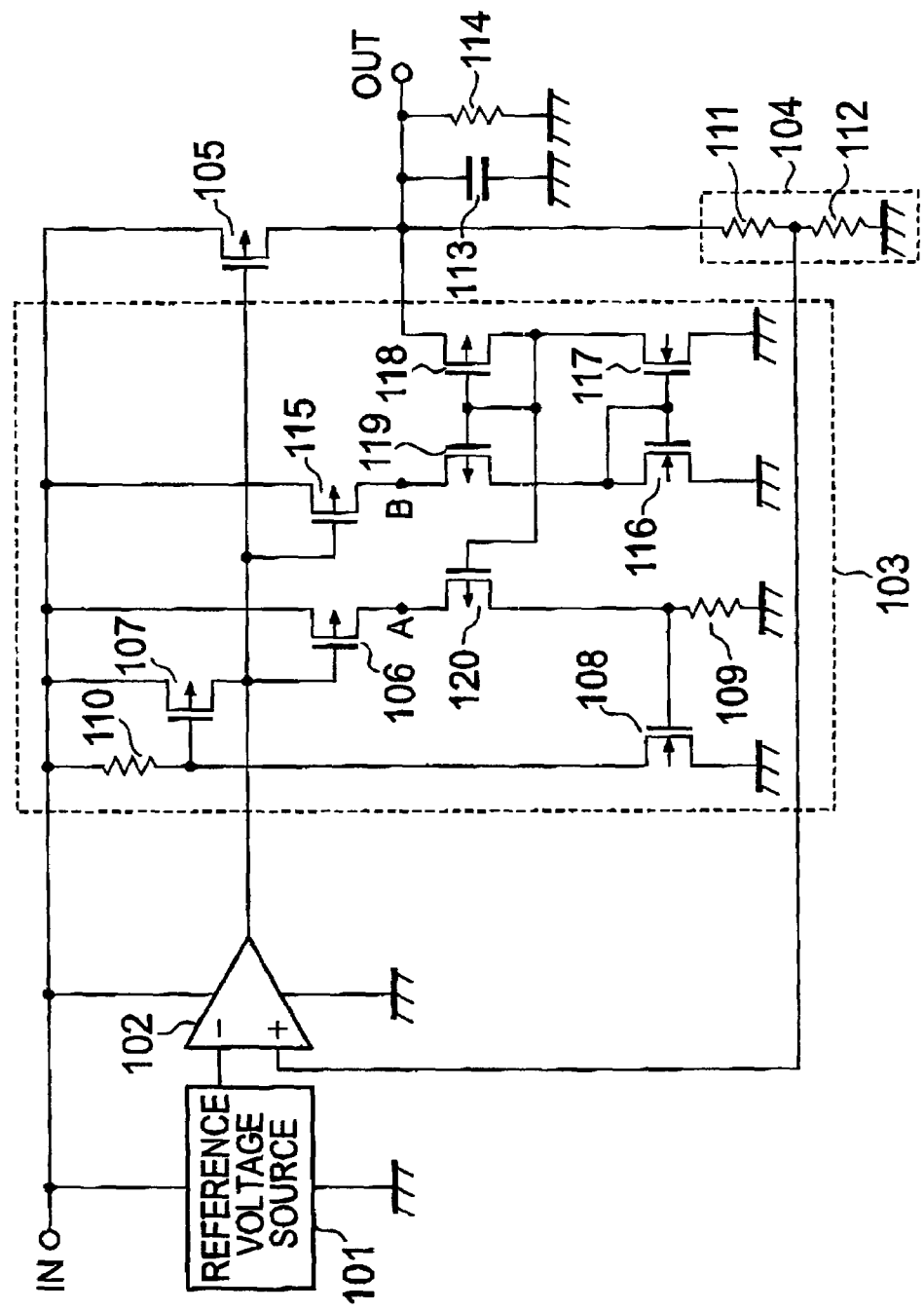
FIG. 3 is a circuit diagram showing a configuration of a conventional voltage regulator.

FIG. 2 is a circuit diagram showing a configuration of a voltage regulator according to a second embodiment of the present invention. The measurement circuit 201 includes a resistor 206 connected between the fuse 205 and the ground, and an NMOS transistor 204 having a source connected to the ground, a drain connected to the measurement terminal TEST, and a gate connected to a node between the fuse 205 and the resistor 206 instead of the NMOS transistor 204 connected between the fuse 205 and the ground in the circuit shown in FIG. 1. A resistance value of the resistor 206 is proportional to the resistance value of the resistor 109. Also, the resistors 206 and 109 are disposed so as to be adjacent to each other in terms of the layout, thereby minimizing differences in proportional relationship of the element size and characteristics between the resistors 206 and 109 due to the manufacture dispersion. In such a manner, the measurement circuit 201 is made an overcurrent detecting circuit equivalent to the actual circuit. It is obvious that the resistance value of the resistor 206 is set so that the load current Ipro permitting the NMOS transistor 204 of the measurement circuit 201 to become a conductive state becomes a target load current value Itype, and the resistance value of the resistor 109 is trimmed in proportion to the set resistance value of the resistor 206, thereby obtaining the same effect as that in Embodiment 1.

Moreover, the voltage regulator according to this embodiment of the present invention includes power saving means for, after the load current Ipro permitting the overcurrent protecting function to be valid is set, electrically disconnecting the measurement circuit 201 from the voltage regulator through the melting of the fuse 205 or the like, thereby preventing a current unnecessary for the actual operation of the voltage regulator from being consumed.

While the first and second embodiments have been described with reference to FIGS. 1 and 2, respectively, the voltage regulator of the present invention is not intended to be limited to any of the configurations shown in the circuit diagrams of the first and second embodiments of FIGS. 1 and 2. That is, the various characteristics of the voltage regulator are adjusted using the measurement circuit 201 including at least one element equivalent to the element as the constituent element of the overcurrent protection circuit of the voltage regulator, thereby allowing a highly precise voltage regulator to be realized.

DESCRIPTION OF SYMBOLS 101 reference voltage source
103 overcurrent protection circuit
104 voltage dividing circuit
201 measurement circuit

What is claimed is:

1. A voltage regulator comprising:
a sense transistor through which a sense current flows in accordance with a magnitude of a load current;
a sense resistor through which the sense current flows;
a control transistor that controls the load current in accordance with a voltage across the sense resistor;
a current measurement transistor that measures the sense current flowing through the sense transistor, the current measurement transistor being disposed adjacent to the sense transistor;
a measuring characteristics transistor that measures characteristics of the control transistor, the measuring characteristic transistor being disposed adjacent to the control transistor; and
a fuse element that is cut after the current measurement transistor measures the sense current and the measuring characteristics transistor measures the characteristics of the control transistor so that a current cannot flow through the current measurement transistor and the measuring characteristics transistor;
wherein a current that flows through the current measurement transistor is equal to the sense current that flows through the sense transistor.

* * * * *